(12) United States Patent
Mehta

(10) Patent No.: US 6,472,308 B1
(45) Date of Patent: Oct. 29, 2002

(54) BORDERLESS VIAS ON BOTTOM METAL

(75) Inventor: Sunil D. Mehta, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/949,276

(22) Filed: Sep. 7, 2001

Related U.S. Application Data

(62) Division of application No. 08/754,564, filed on Nov. 21, 1996, now Pat. No. 6,362,527.

(51) Int. Cl.$^7$ .......................................... H01L 21/4763
(52) U.S. Cl. .................. 438/624; 438/631; 438/634; 438/637
(58) Field of Search .................. 438/622, 624, 438/631, 634, 637

(56) References Cited

U.S. PATENT DOCUMENTS 4,767,724 A * 8/1988 Kim et al. .................. 438/634
6,191,484 B1 * 2/2001 Huang et al. ............... 257/752

* cited by examiner

Primary Examiner—T. N. Quach
(74) Attorney, Agent, or Firm—Gerald Fisher; Deborah Wenour

(57) ABSTRACT

An improved manufacturing process and an improved device made by the process for forming via interconnects between metal layers in a multilevel metallization structure substantially eliminates trench formation during via overetch and exploding vias during via fill. An insulating multilayer structure comprising a conformal oxide, a spin-on layer, and an etch stop layer for the via etch locally planarizes the region adjacent to metal lines before the ILD is deposited and vias are patterned and etched. Using this process, metal borders around vias can be reduced or eliminated, thereby increasing circuit packing density.

16 Claims, 7 Drawing Sheets

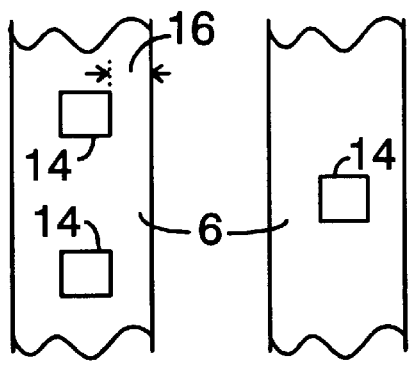
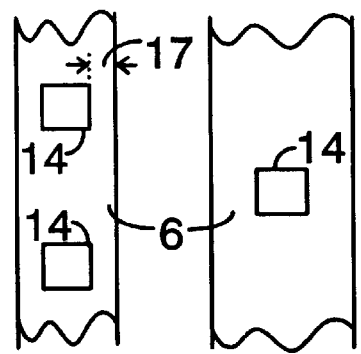
FIG. 2A  FIG. 2B
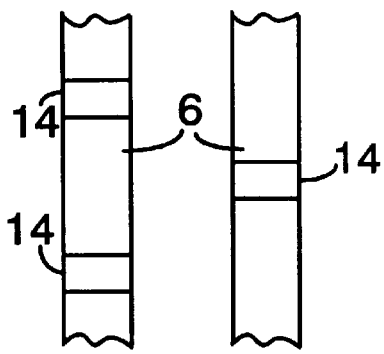
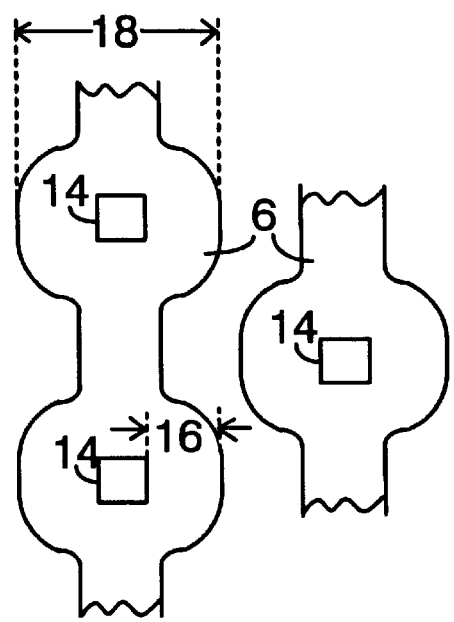
FIG. 2C  FIG. 2D

BORDERLESS VIAS ON BOTTOM METAL

CROSS REFERENCE TO RELATED APPLICATION

This application is a Rule 1.53(b) divisional of application Ser. No. 08/754,564, filed Nov. 21, 1996 U.S. Pat. No. 6,362,527. Application Ser. No. 08/754,564 is hereby incorporated by reference in its entirety into the subject application.

FIELD OF THE INVENTION

This invention relates to processes for formation of vias used for interconnecting metal layers of a multilevel metallization structure employed in integrated circuits.

BACKGROUND OF THE INVENTION

Integrated circuits are becoming increasingly fast, and correspondingly, devices and feature sizes are shrinking. This allows for much higher device packing density on chips, and consequently lower cost per device.

When devices were relatively large, one layer of metal was adequate to provide all of the metal interconnections and other wiring needed to build a complete integrated circuit, without wiring requirements limiting device packing density. To avoid such a limitation as device dimensions have shrunk, it has become necessary to develop multilevel metallization schemes and to reduce certain metal dimensions.

In a single level metallization system, contact is made to the underlying silicon devices through contact holes etched through the dielectric separating the silicon from the interconnect metal. Multilevel metallization systems are comprised of alternating layers of dielectric and metal materials. The metal interconnects on the metal layer closest to the silicon surface (M1), make contact to the underlying silicon devices through contact holes, just as in single level systems. The successive metal layers, designated M1 to M(n), where n is the number of metal layers, are electrically connected to each other as required by appropriately located holes, referred to as vias, through the interlevel dielectric layers (ILD's). The dielectric layer between the silicon surface and the first metal layer closest to the silicon is designated ILD0. Vias are typically filled with a conductor such as aluminum or tungsten. The conducting material filling the via is called a via plug.

Interconnect lines on each metal layer are separated by spaces. These spaces are filled with dielectric when the next dielectric layer is deposited. The width of one metal line plus one space is referred to as pitch. Many factors, including transistor size, circuit layout, and the number of metal layers that can be used, enter into the choice of the pitch for the different metal layers. The minimum pitch for M1 is usually set by the minimum transistor size and by lithography tolerances to insure that adjacent lines, at the minimum pitch, completely cover contacts without shorting to each other. After pitch is determined, the line and space dimensions are defined by circuit performance requirements such as RC time constants and reliability, as well as by the capability of the process to provide lines of minimum width. Minimum pitch for the M2 and M3 layers of metal are generally successively larger than for the M1 level, being determined by factors other than transistor size. If, however, vias are stacked one over another between successive metal layers, as is sometimes done to enhance performance and increase packing density, the pitches of all the layers contacted by the stacked via are generally maintained the same to facilitate layout.

Via dimensions are typically determined by the design current expected to flow through the via plug and by the resistance of the plug itself, as well as by variances and limitations imposed by lithography, etch, and via-fill processes. As device dimensions shrink and the line widths at the lower metallization levels such as M1 and M2 become correspondingly smaller, via cross sectional area decreases, and the via aspect ratio (AR), defined as via height/via width, tends to increase. The via aspect ratio is critical to the determination of how, and with what metal, the via is filled.

The generally preferred manufacturing method of filling vias having AR>1 is Chemical Vapor Deposition of tungsten, (CVD tungsten process). Generally, the CVD tungsten process inherently provides better step coverage than competing processes such as sputtering of aluminum. It therefore is a better choice for uniformly coating the sides and bottoms of holes with high aspect ratio, thus yielding substantially void free plugs. Additionally, the CVD tungsten process is a manufacturing-proven process for filling high aspect ratio vias.

Two somewhat different CVD tungsten processes are in common use.
1. Selective Tungsten CVD, and
2. Blanket Tungsten CVD with Etchback or Chemical Mechanical Polishing (CMP).

Both are based on the chemical reduction of tungsten hexafluoride ($WF_6$), a highly reactive gas. The process used for via fill between two metal layers is Blanket Tungsten CVD. In this process, tungsten hexafluoride is reduced by hydrogen in accordance with the reaction:

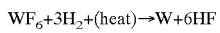

$$WF_6 + 3H_2 + (heat) \rightarrow W + 6HF$$

The blanket tungsten process results in deposition of tungsten over the entire surface of the interlevel dielectric layer, and in filling of the vias over the underlying metal. The underlying metal is usually aluminum or an aluminum alloy, the preferred interconnect metal in most applications. In some applications, the entire tungsten layer deposited on the dielectric surface is subsequently etched back or polished using CMP, leaving only the plug in the via. In other applications the tungsten on the dielectric surface is patterned and used as interconnect metal. This may be accomplished by directly patterning the tungsten, or the ILD may have trenches patterned and etched before tungsten deposition. In this case, when excess tungsten is etched or polished off the surface, metal interconnect lines remain.

Before depositing the CVD tungsten, a thin barrier/ nucleation/adhesion film is deposited on the dielectric surface and into the vias, coating the underlying aluminum with a protective barrier. This barrier prevents damaging interaction between the aluminum and the reactants and reaction products of the tungsten deposition. Preferred materials for the barrier/nucleation/adhesion film are TiN and TiW, with TiN being the most frequently used. A serious yield problem arises if, for any reason such as worst case tolerance buildup, misalignment of vias and the underlying metal result in vias not mating properly and extending outside of the underlying metal. This results in formation of trenches in the dielectric adjacent the metal lines during via overetch. The portion of the via extending beyond the metal can etch downward to the next lower metal layer or to the silicon in extreme cases, causing an interlevel short. Additionally, the trenches have high aspect ratio, and are difficult to completely fill with tungsten. Low density metal or actual metal voids in the trench regions can result, trapping gases therein and causing reliability problems. Finally, there is a high probability that the edge of the underlying aluminum interconnect metal, exposed due to the misalignment, will not be adequately protected by the barrier layer. This would result in a violent chemical reaction between the exposed aluminum and the $WF_6$ and/or HF during deposition of the tungsten plug, causing severe damage to the structure. This phenomenon has been termed "exploding vias".

To insure that interconnect metal and via plug make contact over the entire end surface of the plug and to reduce the occurrence of trench formation, exploding vias, and interlevel shorts, it has been common practice to provide for a minimum required border of metal around the via. This border or overlap is intended to account for any variations in metal and via dimensions and also for any misalignment tolerance of the lithography tool used. Borders are made sufficiently large to assure that vias do not extend beyond the underlying metal under worst case conditions of misalignment and/or dimensional tolerance buildup. If the metal line width is not adequate to provide the minimum required border, it is increased where it encounters a via, as shown in FIG. 2d. Since the minimum space can not decrease where the line width increases, the minimum pitch in this contacted case is greater than the non-contacted pitch previously described. This practice has the disadvantage of limiting the device packing density due to the increase in contacted metal pitch.

Design rules establishing the minimum size of borders around vias can be tightened; allowing smaller borders around vias if:

1. Tolerances associated with line, space, and pitch dimensions are reduced, and/or,
2. Tolerances associated with misalignment of vias caused by lithography are reduced.

While these steps will reduce the loss in device packing density caused by an increase in metal pitch due to widening of metal lines at vias, they do not fully compensate for that loss, and they also introduce added cost to the manufacturing process.

The use of borderless vias is attractive from a packing-density and manufacturing cost viewpoint, but all of the aforementioned problems associated with misalignment are magnified in this case. A method for solving the exploding via problem for borderless vias is described by the inventor in an earlier U.S. patent application Ser. No. 08/595,150 (B279), which is hereby incorporated by reference. According to this earlier method, a conformal protective insulating cap layer, silicon nitride or silicon oxynitride by way of example, is deposited over the metal line before ILD deposition. A two step directional via etch is utilized. The first portion of the etch has high selectivity, with high oxide etch rate compared with nitride etch rate. The nitride cap layer thereby acts as an etch stop on the top metal surface. Although for misaligned vias, a trench forms in the dielectric adjacent the metal lines during via overetch, the nitride on the metal sidewalls is substantially unaffected during via overetch due to the high selectivity. The second portion of the etch removes the nitride cap layer atop the metal lines, but due to its high directionality, leaves the sidewall cap layer substantially intact. The metal sidewalls are thus protected by the cap layer from $WF_6$, thereby substantially eliminating the exploding via problem. The method as described above does not address the aforementioned problem of trench formation adjacent the metal lines, with the associated consequences of interlevel shorts and metal voids in the high aspect region.

A method for minimizing trench formation for slightly misaligned borderless vias is described by the inventor in U.S. patent application Ser. No. 08/601,541 (B077)U.S. Pat. No. 5,619,072, which is hereby incorporated by reference. According to this method, an insulating sidewall spacer is formed on the metal lines by deposition and etchback, before depositing the thick ILD and performing via etch. The sidewall spacer is comprised of an etch stop material relative to the oxide via etch, silicon nitride by way of example. For slightly misaligned vias, the portion of the via extending beyond the metal line falls above the spacers, and therefore during via overetch the etch stop material of the spacers prevents formation of a deep trench in that region, thereby lessening the probability of interlevel shorts. This method does not fully address the exploding via problem, since during etchback for sidewall spacer formation, the corner of the metal line may be exposed. This is true particularly since nitride is seen to be thinner at the metal corner, and nitride etch rate is experimentally observed to be enhanced near the corner. Additionally, the amount of misalignment tolerated by this process is limited to the thickness of the sidewall spacers, generally approximately 0.10–0.15 microns.

A single method which would substantially eliminate trench formation for slightly or moderately misaligned borderless vias and would additionally prevent exposure of metal sidewalls would provide a substantially complete solution to the problems of via etch-induced interlevel shorts and metal voids in the high aspect region, as well as preventing exploding vias.

SUMMARY OF THE INVENTION

I have provided an improved manufacturing process for forming via interconnects between metal layers in a multi-level metallization structure. This process substantially eliminates trench formation adjacent metal lines during via overetch, and prevents exploding vias, via metal voids in the trenches, and interlevel shorts caused by via overetch.

It is an object of this invention to provide an improved manufacturing process for fabricating multilevel metallization structures.

It is a further object to provide a manufacturing process which improves yield in the fabrication of multilevel metallization structures.

It is a further object to provide an integrated circuit with an improved multilevel metallization structure which permits higher device packing density on chips.

It is a further object to provide a manufacturing process which allows reducing the contacted pitch on metal layers of multilevel metallization structures.

It is a further object to provide a manufacturing process which permits the use of borderless vias in multilevel metallization structures.

It is a further object to provide a manufacturing process which permits loosening of the design rules that establish the minimum size of borders around vias in the fabrication of multilevel metallization structures.

It is a further object to provide a manufacturing process which substantially eliminates trench formation adjacent metal lines during via overetch.

It is a further object to provide a manufacturing process which substantially eliminates interlevel shorts between metal layers caused by via overetch.

It is a further object to provide a manufacturing process which substantially eliminates via metal voids adjacent metal lines, caused by via overetch.

It is a further object to provide a manufacturing process which substantially eliminates the problem of exploding vias in the fabrication of multilevel metallization structures.

It is a further object to provide a manufacturing process tolerant of misalignment of vias and underlying metal in the fabrication of multilevel metallization structures.

BRIEF DESCRIPTION OF THE DRAWINGS

FIG. 2a shows a plan view of vias and underlying metal interconnect lines with minimum required borders provided.

FIG. 2b shows a plan view of vias and underlying metal interconnect lines with less than minimum required borders provided.

FIG. 2c shows a plan view of vias and underlying metal interconnect lines with no borders.

FIG. 2d shows a plan view of vias and underlying metal interconnect lines widened around the vias to provide minimum required borders.

It should be noted that the figures are not drawn to scale and that the proportions of illustrated parts do not reflect actual dimensions as they relate to implementation of the invention.

DETAILED DESCRIPTION OF THE INVENTION

Figure 1:
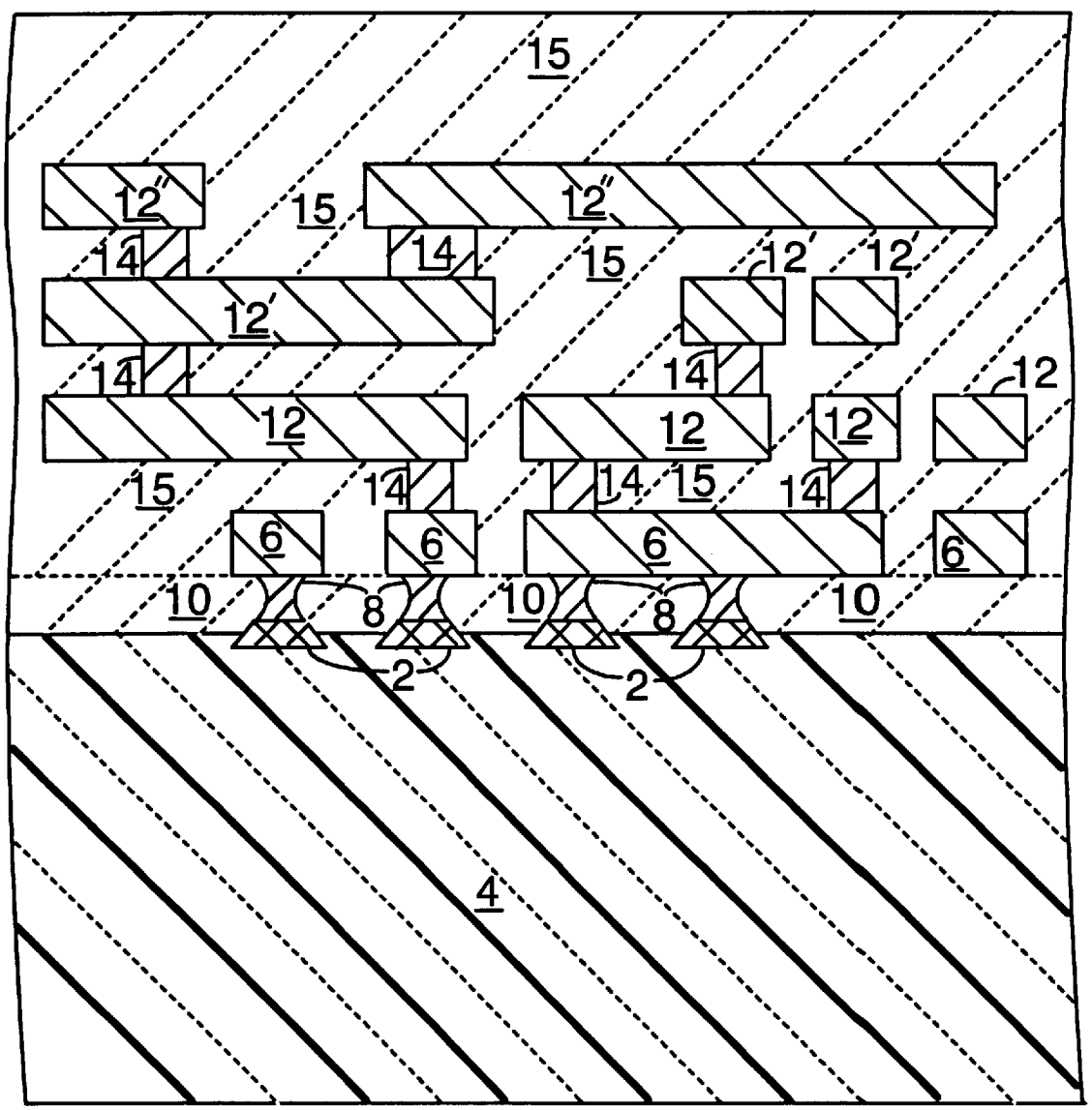
FIG. 1 is a schematic cross section of a four level metallization system interconnecting devices on a silicon wafer.

FIG. 1 shows a cross section of a multi-level metallization system which could utilize this invention. Devices 2 in silicon wafer 4 are connected to first layer (M1) of metal interconnects 6 through contact openings 8 in dielectric layer ILD0 10. Layer of metal interconnects 6 is connected to metal layer 12, and layer 12 is connected to layer 12', through vias 14 in interlevel dielectric 15. My invention is applicable to via interconnects and to the process for forming them between any two metal layers.

With reference to FIGS. 2a–2d, vias 14, of constant dimension, are shown on adjacent underlying metal lines 6, of varying width. In FIG. 2a, minimum required metal borders 16 are provided around the vias. In FIG. 2b, borders 17, less than minimum required borders 16, are provided around the vias. FIG. 2c illustrates borderless vias. In FIG. 2d, metal line width 18 adjacent via 14 is increased to meet the condition for minimum required borders 16. The probability of dimensional tolerance buildup causing vias to extend outside underlying metal is high in the cases illustrated in FIG. 2b and FIG. 2c. My invention provides a process for substantially eliminating catastrophic yield and reliability problems most likely to occur in such cases. My invention is also applicable in cases where minimum border requirements are satisfied.

According to my invention, a conformal oxide is deposited over a metal line, followed by application of a spin-on material such as spin-on-glass (SOG) to locally planarize the surface. Oxide etchback to the metal line yields a substantially flat surface, whereby the metal line is embedded in a dielectric layer. A silicon nitride or oxynitride etch stop layer is then deposited on this substantially flat surface, followed by thick ILD deposition and via etch. The flat etch stop layer surrounding the metal lines prevents trenching during via etch.

Figure 3:
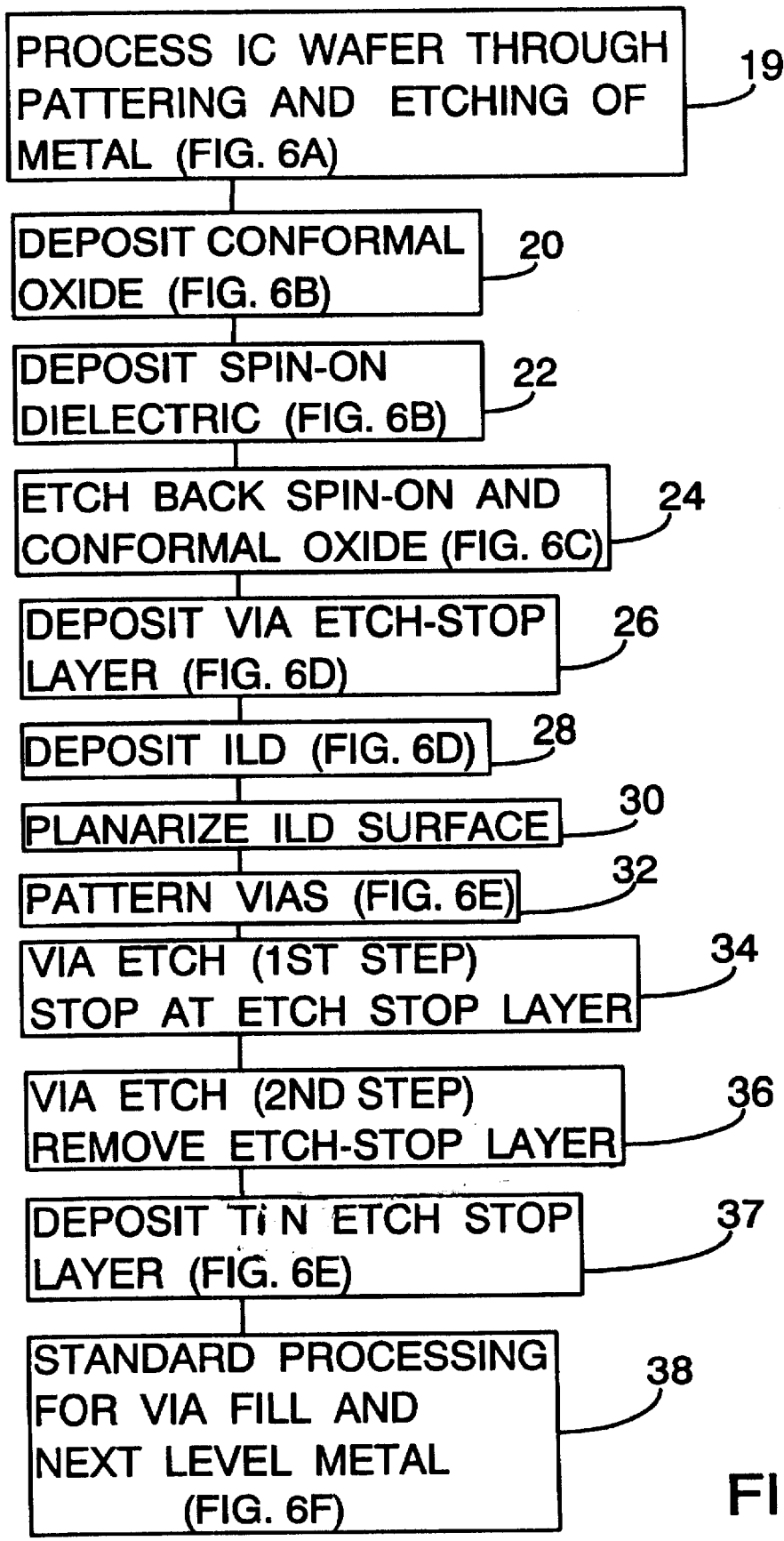
FIG. 3 is a process flow embodiment utilizing this invention.

With reference to FIG. 3, a preferred process flow embodiment utilizing this invention is described. In step 19, an integrated circuit wafer is processed through patterning and etching of the first metal layer 6 of the multilevel metallization structure, utilizing standard processes which are not part of this invention. The standard processes for metal and ILD deposition, patterning, and etching are described in "Handbook of Multilevel Metallization for Integrated Circuits", S. Wilson, C. J. Tracy, J. T. Freeman Jr., eds, Noyes Publications, 1993, pp. 126–169, pp. 461–569. By way of example in CMOS technology, after formation of the source/drain regions, ILD0 10, usually comprising $SiO_2$, is deposited, contact holes 8 are patterned, etched and filled, and the first metal layer 6, usually aluminum or an aluminum alloy, is deposited, patterned and etched, to form the M1 interconnect structure. In step 20, a thin conformal oxide layer, approximately 2000–3000 Angstroms thick and formed by Plasma Enhanced Chemical Vapor Deposition (PECVD) of tetraethylorthosilicate (TEOS) by way of example, is deposited over the exposed metal and dielectric surfaces. In step 22, a planarizing layer such as spin-on-glass (SOG) is applied over the metal and conformal oxide layer to fill gaps between adjacent metal lines. In step 24, the SOG and conformal oxide layer are etched back to the surface of the metal lines, leaving a locally planar oxide surrounding the metal. In step 26, a thin silicon nitride layer, 500 Angstroms thick by way of example, is deposited over the metal and oxide surfaces, to serve as a via etch stop. In step 28, a thick ILD film, usually TEOS, is deposited over the nitride layer. In step 30, the ILD surface is planarized, by Chemical Mechanical Polishing by way of example. In step 32, the vias are patterned using standard techniques. In step 34, the first step of a directional two-step via etch process etches through the ILD but stops at the nitride etch stop layer. In step 36, the second step of a two-step via etch process etches through the nitride etch stop layer to expose the underlying metal. In step 38, standard via-fill and metallization processing continues.

Figure 4:
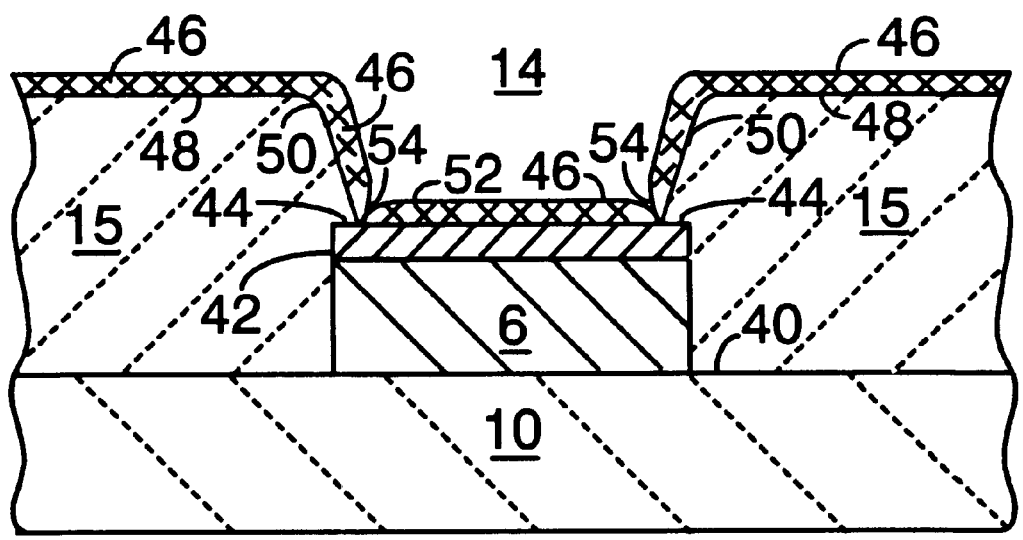
FIG. 4 is a cross sectional view of a via centrally aligned with respect to an underlying metal line, not utilizing this invention.
Figure 5:
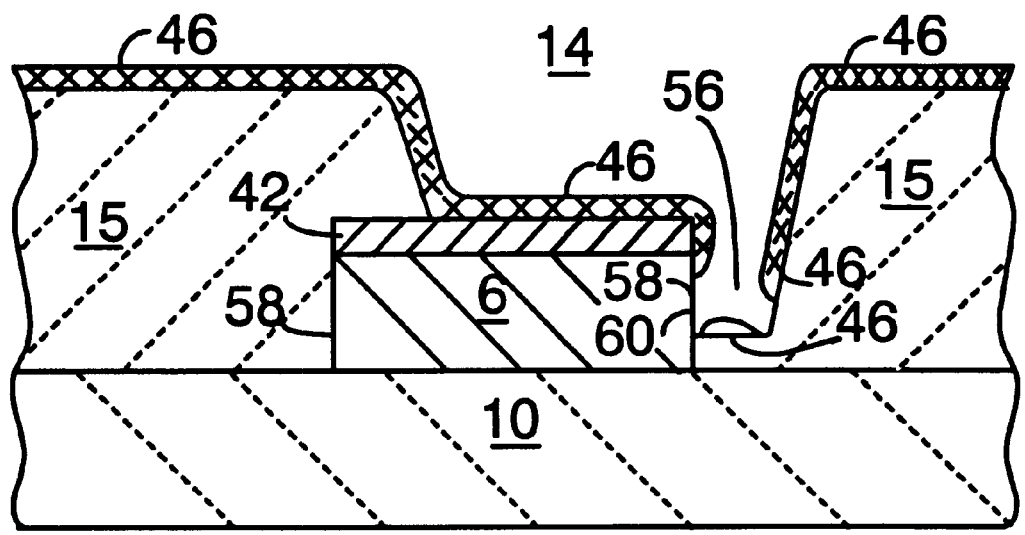
FIG. 5 is a cross sectional view of a via misaligned with respect to an underlying metal line, not utilizing this invention, showing trench formation.

FIGS. 4 and 5 illustrate the source of the trench formation and the exploding via phenomenon when this inventive process is not utilized.

With reference to FIG. 4, metal interconnect line 6 in the first metal layer is shown in cross section on surface 40 of dielectric layer (ILD0)10. An electrically conducting coating 42 which is chemically inert with respect to reactants and reaction products of the Blanket Tungsten CVD via fill process, is shown deposited on first metal layer 6 before patterning and etching of the metal. This coating 42 may also serve as an antireflection coating (ARC) which, by way of example, may be approximately 1100 Angstroms thick and preferably be comprised of TiN. Via 14, reactively ion etched with standard equipment through interlevel dielectric layer (ILD1) 15, is shown in substantially perfect alignment with underlying metal interconnect line 6, leaving uniform border 44 and 44' around via 14. A barrier/nucleation/adhesion layer 46, also referred to as the "glue layer", is deposited on top surface 48 of interlevel dielectric layer 15, and on via sidewall 50, and on underlying conductive surface 52, and provides a substantially continuous barrier preventing a chemical reaction between interconnect line 6 and reactants and reaction products $WF_6$ and HF of the subsequent Blanket Tungsten CVD via fill process. In this case of a properly aligned via, the ARC layer 42 also provides added chemical isolation of the aluminum interconnect metal from $WF_6$ and HF. This can be particularly important at the intersection 54 of surfaces within vias, where discontinuities in the thin barrier/nucleation/adhesion layer 46 are likely to occur. The barrier/nucleation/adhesion layer 46 additionally promotes adhesion of CVD tungsten (not shown) to surfaces 48, 50 of interlevel dielectric layer 15.

With reference to FIG. 5, via 14 is shown misaligned with respect to underlying metal line 6, causing via 14 to extend beyond metal line 6. During via overetch, this results in deep etching of dielectric 15, and formation of high aspect ratio or "trench" region 56, adjacent to edge 58 of metal line 6. This is the so-called trenching effect, which in extreme cases can cause shorting between metal layers or between metal and the substrate, and which can cause metal voids due to the extremely high aspect ratio of the trench. Barrier/nucleation/adhesion layer 46 will, with some probability, have one or more discontinuities 60 on metal edge 58 in high aspect ratio region 56. Metal edge 58 of aluminum interconnect line 6, having no ARC, is therefore directly exposed to reactants and reaction products $WF_6$ and HF of the subsequent Blanket Tungsten CVD via fill process at the discontinuities 60. This can result in a violent chemical reaction and severe damage to the structure, referred to as exploding via. FIG. 6 illustrates how my inventive process and structure prevents the trenching effect and exploding vias.

Figure 6A:
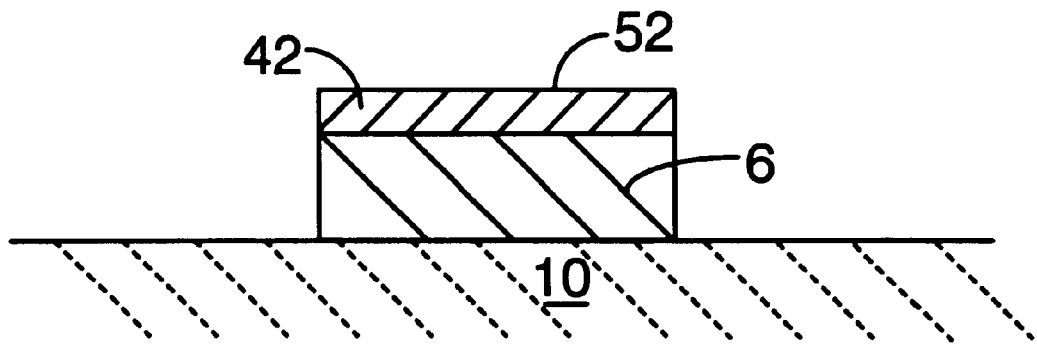
FIG. 6a is a cross sectional view of a metal line atop a dielectric layer.

FIGS. 6a to 6f illustrate the preferred process flow embodiment yielding the structure of my invention. In FIG. 6a, a metal layer is deposited onto dielectric 10, then patterned and etched to form metal line 6. The metal line 6 is generally comprised of Al or an Al alloy, and may have multilayer structure. Generally, the anti-reflective coating (ARC) 42 forms the top layer of the metal line 6. In some applications however, a "hard mask" layer comprised of $SiO_2$, $Si_3N_4$, or $SiO_xN_y$, may be deposited atop ARC 42 or in place of ARC 42, to protect top conducting surface 52 in the case of resist erosion during metal etch. In this case, the portion of the hard mask within the via is removed during or after via etch.

Figure 6B:
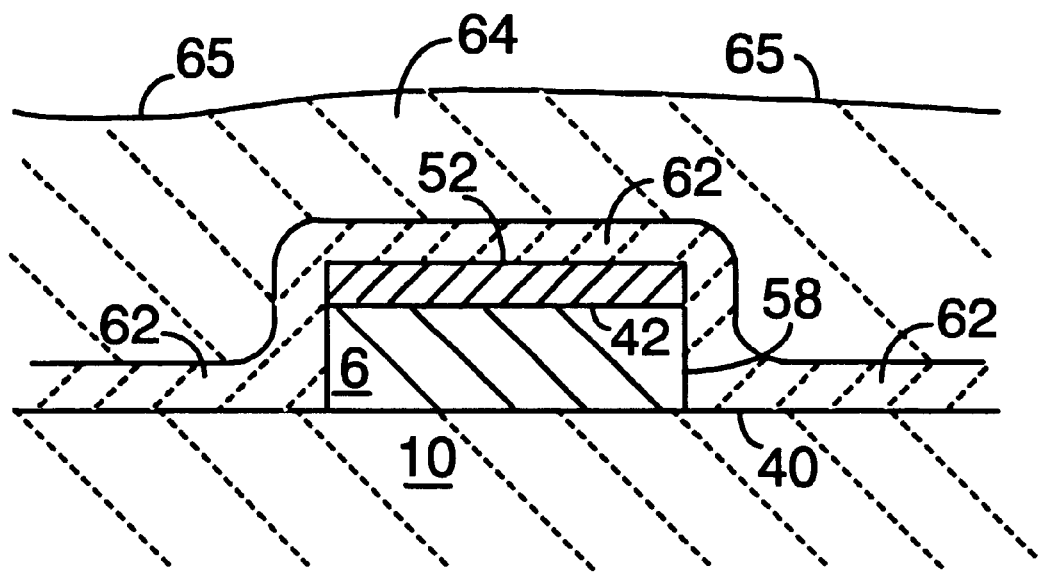
FIG. 6b is a cross sectional view of a metal line with conformal oxide and spin-on layers deposited thereon.

In FIG. 6b, a thin conformal oxide layer 62 is deposited onto exposed metal and dielectric surfaces 52, 58, and 40. Oxide layer 62 may be comprised of CVD or PECVD oxide by way of example, and serves multiple purposes, including rigidly confining sidewalls 58 of metal line 6 to prevent stress-induced metal eruptions. Additionally, oxide layer 62 provides chemical isolation between metal line 6 and the spin-on layer described hereinafter. Thereafter, a spin-on film 64 with low viscosity is applied atop oxide layer 62 to locally planarize the surface region 65 adjacent metal line 6. The spin-on film 64 is generally spin-on-glass (SOG), but may be comprised of other spin-on materials such as spin-on-silicate (SOS) or hydrogen silsesquioxane (HSQ), also known by the trade name of Flowable Oxide (FOx) by Dow-Corning Company. Since many of the spin-on materials are organic materials, they may react chemically with exposed metal, and are therefore usually sandwiched between oxide layers in production processes.

Figure 6C:
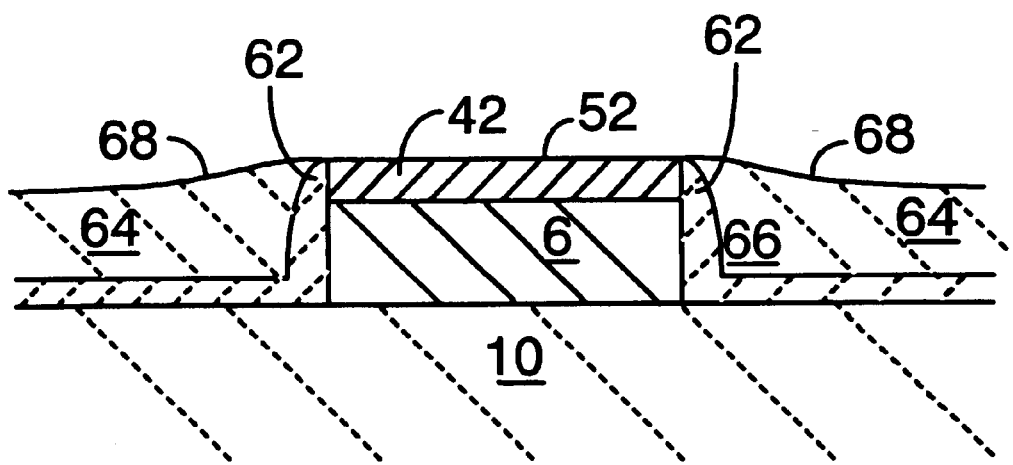
FIG. 6c is a cross sectional view of the metal line and oxide and spin-on layers of FIG. 6b, after etchback.

As illustrated in FIG. 6c, the spin-on and conformal oxide layers 62 and 64 are thereafter etched back to the top surface 52 of metal line 6. The etchback may use Reactive Ion Etching (RIE) with $CF_4/CHF_3/Ar$ chemistry by way of example, and the TiN ARC layer 42 provides an effective etch stop. Metal line 6 is embedded in dielectric layer 66 comprising conformal oxide 62 and spin-on layer 64. Top surface 68 of dielectric layer 66 is substantially planarized with top surface 52 of metal line 6 in the vicinity of metal line 6. This is known as local planarization.

Figure 6D:
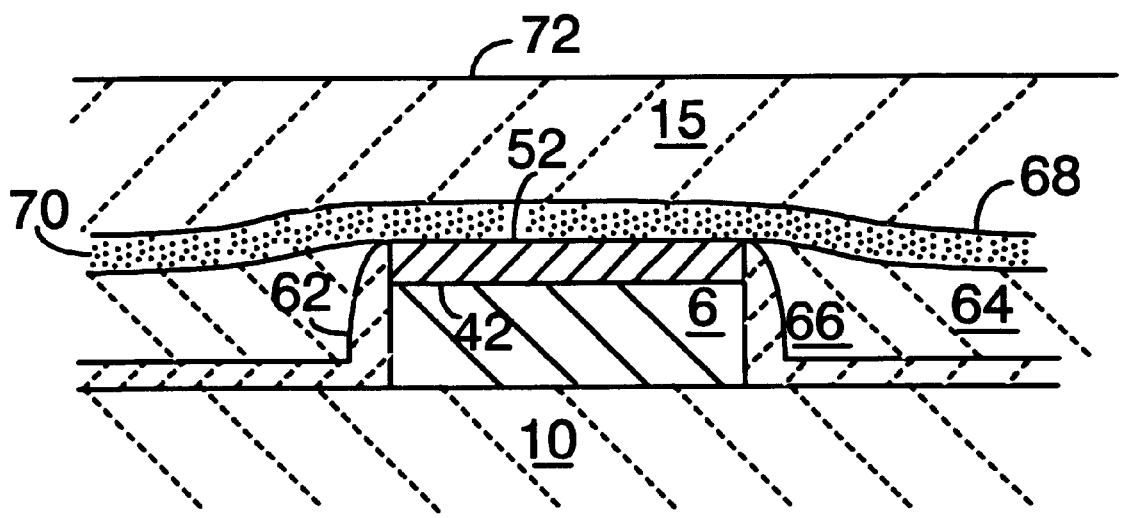
FIG. 6d is a cross sectional view of the metal line and etched back layers of FIG. 6c, with etch stop layer and ILD layer deposited thereon.

In FIG. 6d, a thin (500 Angstrom by way of example) etch-stop film 70 which may be comprised of silicon nitride or silicon oxynitride by way of example is deposited onto top surfaces 52 and 68 of metal line 6 and dielectric 66. A thick ILD layer 15, comprised of a CVD oxide such as TEOS, is deposited atop etch-stop layer 70. Top surface 72 of ILD 15 is planarized, usually by CMP.

Figure 6E:
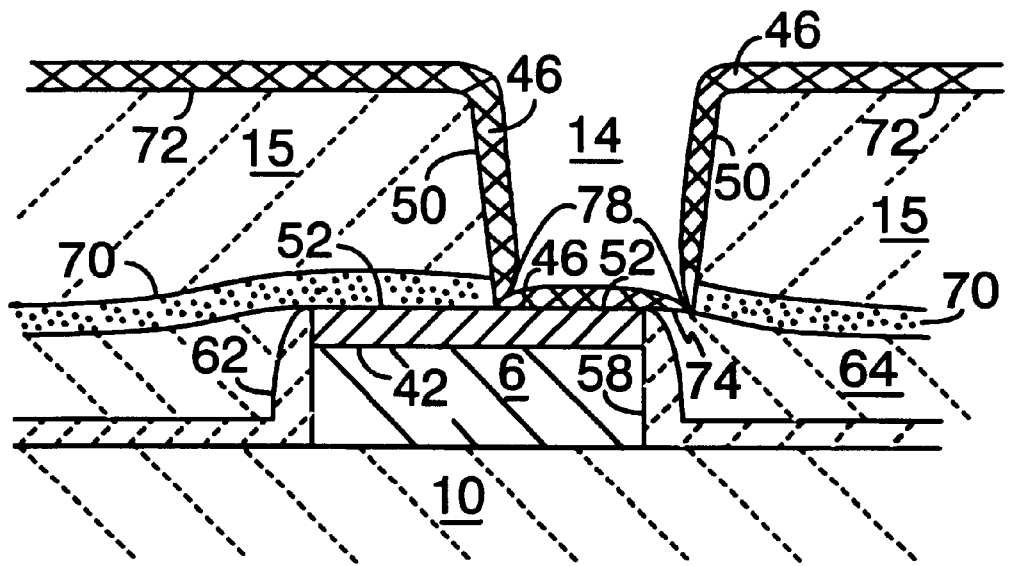
FIG. 6e is a cross sectional view of the metal line and dielectric layers of FIG. 6d, after via etch, removal of etch stop layer, and deposition of glue layer.

FIG. 6e shows the structure after via 14 is patterned and etched by a two-step directional etch process. The first etch step has high selectivity of oxide to nitride, and etches the via hole 14 while stopping at nitride etch-stop layer 70. These etch characteristics can be achieved by utilizing $C_4F_8$ or $C_4F_8/CH_3F$ etch chemistry in an Applied Materials Model 5300 reactive ion etch system, by way of example. Edge portion 74 of via 14 which extends past edge 58 of metal line 6 is prevented from forming a trench by etch stop layer 70, which is substantially planar with top edge 52 of metal line 6 in the vicinity of the metal line, due to application of spin-on layer 64. Thereafter, the nitride etch stop layer 70 is removed by the second step of the via etch process, which has high selectivity of nitride to oxide. These etch characteristics can be achieved by utilizing $CH_3F/O_2$ etch chemistry in an Applied Materials Model 5300 reactive ion etch system, by way of example. The photoresist used to pattern the via may be stripped either before or after the nitride etch step. Glue layer 46, comprised of TiN or Ti/TiN by way of example, is deposited onto bottom 52 and sides 50 of via 14, as well as onto top surface 72 of ILD 15. Any discontinuities 60 in glue layer 46 are most likely to occur at inner corners 78.

Figure 6F:
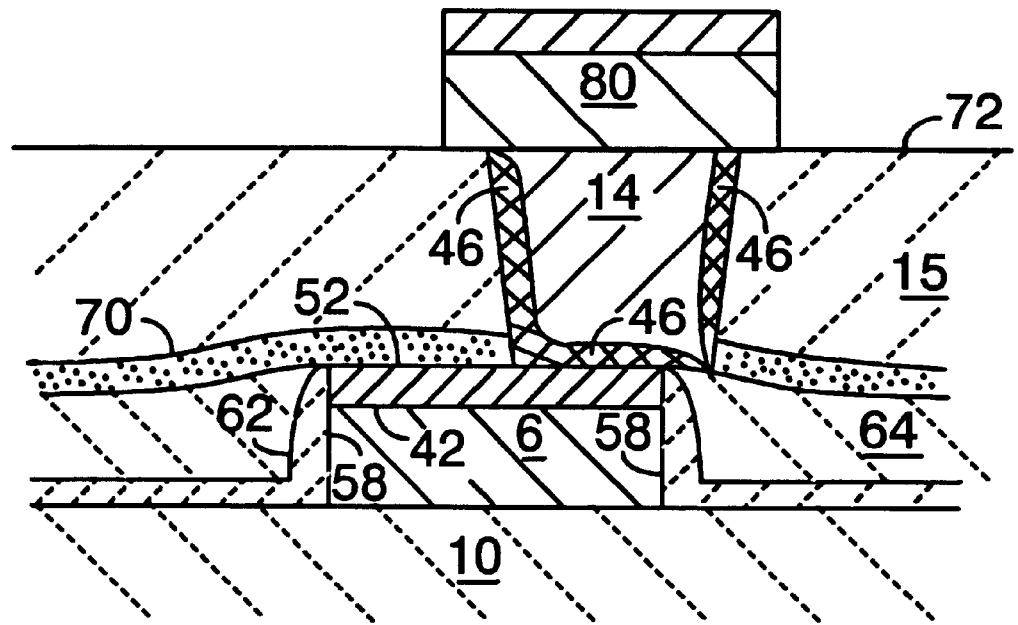
FIG. 6f is a cross sectional view of the metal line, dielectric layers, and via of FIG. 6e, after formation of via plug and next level of metal.

In FIG. 6f, standard processing completes the formation of via plugs and next level of metal. CVD tungsten is deposited into via 14 and onto top surface 72 of ILD 15 by Blanket Tungsten CVD. The glue layer 46 prevents contact between the Al line 6 and the $WF_6$ of the Blanket Tungsten CVD process. Additional protection is provided by ARC layer 42 on top metal surface 52, and by dielectrics 62 and 64 at metal sidewall surfaces 58. As a result, even if discontinuities exist in glue layer 46, the exploding via phenomenon is prevented. Thereafter, excess tungsten and glue layer on top surface 72 of ILD 15 is removed by CMP, and the next level of metal 80 is deposited, patterned, and etched.

Utilizing my inventive process as described, the problem of trench formation adjacent metal lines during via overetch and the problem of exploding vias are substantially eliminated for moderately misaligned borderless vias, thereby increasing yield and allowing increased packing density.

Although the preferred process described herein utilizes a conformal oxide layer, a planarizing spin-on layer and a nitride etch stop layer, the invention should not be considered limited to any or all of these exact implementations. Other possible types of conformal oxides may include: $SiH_4/O_2$, subatmospheric CVD, and Low Pressure CVD (LPCVD), also termed LTO. Other possible spin-on materials may include polyimide and parylene. Other possible via etch stop materials may include $Al_2O_3$ and polysilicon. The scope of the invention should be construed in light of the claims. With this in mind,

I claim:

1. An integrated circuit manufacturing process for fabricating a borderless via for interconnecting a first bottom metal line to a second top metal line in a multilevel metallization structure on a semiconductor substrate, said first bottom metal line having a top conducting surface, comprising the steps of:

providing a semiconductor substrate having devices therein to be connected, having an insulating layer on said substrate, and having a bottom metal layer deposited onto said insulating layer on said substrate;

patterning and etching said bottom metal layer to provide said first bottom metal line having an exposed top conducting surface and an edge surface, and to expose portions of said insulating layer;

forming a dielectric layer surrounding said bottom metal line, said dielectric layer having a top dielectric surface substantially locally planar with said top conducting surface of said bottom metal line near said bottom metal line;

depositing a non-conducting via etch stop layer onto said top conducting surface of said bottom metal line and said top dielectric surface;

depositing an ILD layer onto said via etch stop layer;

etching a via having a first and a second portion through said ILD layer to expose the region of said via etch stop layer under said via, said via etch stop layer being substantially unetched by said via etch, said first via portion being atop said via etch stop layer atop said bottom metal line, and said second via portion being atop said via etch stop layer atop said dielectric layer, said via having a bottom surface and a side surface;

removing said exposed region of said via etch stop layer to expose the region of said top conducting surface of said bottom metal line and the region of said top dielectric surface under said via;

depositing a barrier/nucleation/adhesion layer onto said via side surface and onto said exposed portion on said top conducting surface of said bottom metal line and said top dielectric surface; and filling said via with a conductive material wherein during said via filling step said top surface and said edge surface of said bottom metal line are protected by intervening layers from exposure to reactants and reaction products of said via filling step.

2. The process of claim 1, further comprising the steps of:

depositing a top layer of metal atop said ILD and said filled via; and patterning and etching said top metal layer to form said top metal line.

3. The process of claim 1, wherein the step of forming said dielectric layer comprises the steps of:

depositing a conformal dielectric layer onto said top conducting surface of said bottom metal line and said edge surface of said bottom metal line, and onto said exposed portions of said insulating layer;

forming a layer of spin-on dielectric on said conformal dielectric layer;

etching back said spin-on and said conformal dielectric layers to expose said top conducting surface of said bottom metal line, thereby forming a top surface of said etched back dielectric layers substantially locally planar with said top conducting surface near said bottom metal line.

4. The process of claim 3, wherein said conformal dielectric is selected from the group consisting of: PECVD of TEOS, PECVD of $SiH_4/O_2$, LPCVD of TEOS, LPCVD of $SiH_4/O_2$, subatmospheric CVD of TEOS, and subatmospheric CVD of $SiH_4/O_2$.

5. The process of claim 4, wherein said spin-on dielectric is selected from the group consisting of: SOG, SOS, HSQ, Flowable Oxide, polyimide, and parylene.

6. The process of claims 5, wherein said via etch stop layer is selected from the group consisting of: silicon nitride, silicon oxynitride, $Al_2O_3$, and polysilicon.

7. The process of claim 6, wherein said via etching step comprises a first reactive ion etch having etch rate selectivity for said ILD layer over said via etch stop layer of 4:1 or greater.

8. The process of claim 7, wherein said first reactive ion etch utilizes an etch chemistry selected from the group consisting of: $C_4F_8$ and $C_4F_8/CH_3F$.

9. The process of claim 8, wherein said step of removing said via etch-stop layer comprises a second reactive ion etch having etch rate selectivity for said via etch-stop layer over said dielectric layer of 1:1 or greater.

10. The process of claim 9, wherein said second reactive ion etch utilizes $CH_3F/O_2$ chemistry.

11. The process of claim 10, wherein said metal line is comprised of Al or an aluminum alloy.

12. The process of claim 11, wherein said metal line has a hard mask thereon, said hard mask being selected from the, group consisting of: $SiO_xN_y$, $SiO_2$, and $Si_3N_4$.

13. The process of claim 11, wherein said metal line has an ARC layer with a top surface thereon, said top surface of said ARC layer thereby being said top conducting surface of said bottom metal line.

14. The process of claim 13, wherein said ARC layer is selected from the group consisting of: TiN, TiW, and Ti.

15. The process of claim 13, further comprising the steps of:

depositing a barrier/nucleation/adhesion layer onto said via sides and onto said exposed portion of said top conducting surface of said bottom metal line, and;

filling said via with a conductive material;

depositing a top layer of metal atop said ILD;

patterning and etching said top metal layer to form said top metal line.

16. The process of claim 15, wherein said barrier/nucleation/adhesion layer is selected from the group consisting of TiN and TiW.

* * * * *